United States Patent [19]

Fleischer

[11] Patent Number: 5,191,240
[45] Date of Patent: Mar. 2, 1993

[54] BICMOS DRIVER CIRCUITS WITH IMPROVED LOW OUTPUT LEVEL

[75] Inventor: Bruce M. Fleischer, Chappaqua, N.Y.

[73] Assignee: International Business Machines Corporation, Armonk, N.Y.

[21] Appl. No.: 710,592

[22] Filed: Jun. 5, 1991

[51] Int. Cl.[5] ...................... H03K 19/02; H03K 19/08
[52] U.S. Cl. .................................. 307/446; 307/570; 307/300
[58] Field of Search ................. 307/446, 570, 451, 300

[56] References Cited

U.S. PATENT DOCUMENTS

| | | | |
|---|---|---|---|
| 4,678,943 | 7/1987 | Uragami et al. | 307/446 |
| 4,694,203 | 9/1987 | Uragami et al. | 307/446 |
| 4,733,110 | 3/1988 | Hara et al. | 307/446 |
| 4,779,014 | 10/1988 | Masuoka et al. | 307/570 |
| 4,845,386 | 7/1989 | Ueno | 307/446 |
| 4,890,017 | 12/1989 | Masuda et al. | 307/446 |
| 4,902,914 | 2/1990 | Masuoka | 307/446 |

*Primary Examiner*—David Hudspeth
*Assistant Examiner*—Andrew Sanders
*Attorney, Agent, or Firm*—Scully, Scott, Murphy & Presser

[57] ABSTRACT

A BiCMOS driver circuit with an improved low output level which is closer to ground than in prior art circuits, both at full speed and with a static (resistive) load. The driver circuit incorporates a gated diode pull-down with a lower voltage drop than in prior art driver circuits, in which a bipolar output transistor remains on for output voltages down to about 0.3V. The voltage drop of the gated diode is set by device size ratios to be less than 0.5V without driving the output transistor into hard saturation. In the circuit, a gated diode pull-down NPN transistor is coupled between an output terminal and ground. A first CMOS transistor pair is coupled between the output terminal and the base of the pull-down NPN transistor, and a second CMOS transistor pair is coupled between the output terminal and the power supply $V_{DD}$. The circuit has improved low output level and high-to-low transitions. The circuit has particular applications to many types of logic gates, for example in NAND gates, NOR gates, and inverters, as are used extensively in static or dynamic random access memory logic circuits. Although the disclosed embodiments herein are for NAND gates, one skilled in the art could readily implement the teachings of the present invention in other logic circuits and gates, such as NOR gates and inverters with minor changes in the circuitry.

5 Claims, 5 Drawing Sheets

BiCMOS NAND WITH LOW-DROP GATED DIODE

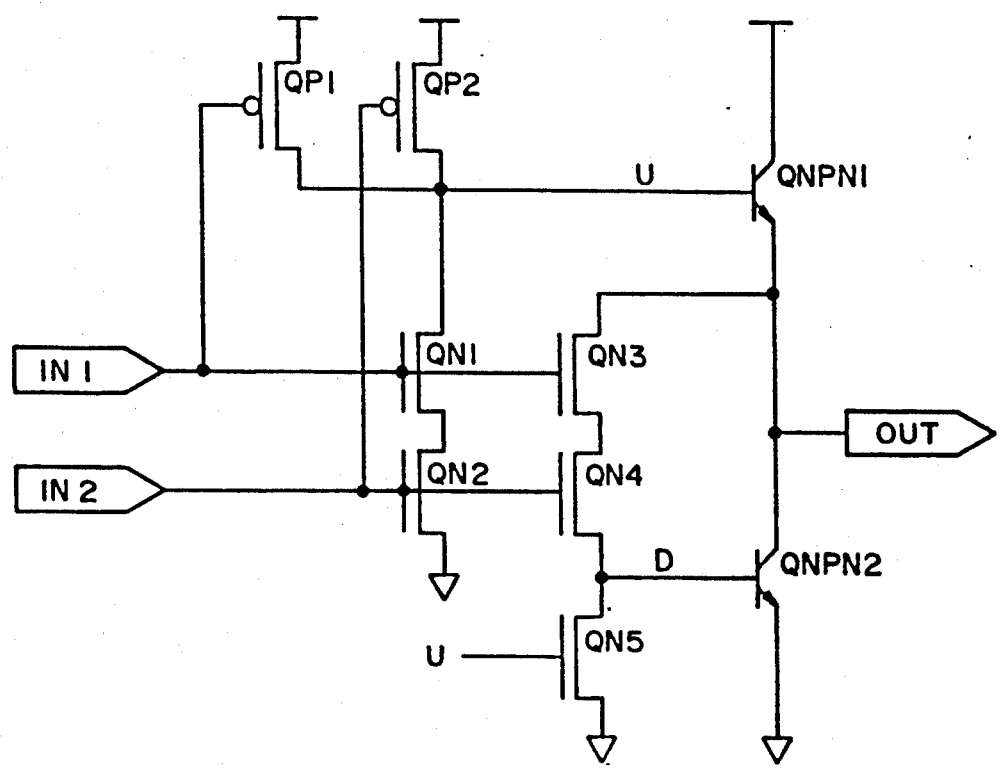
FIG.1 PRIOR ART BiCMOS NAND
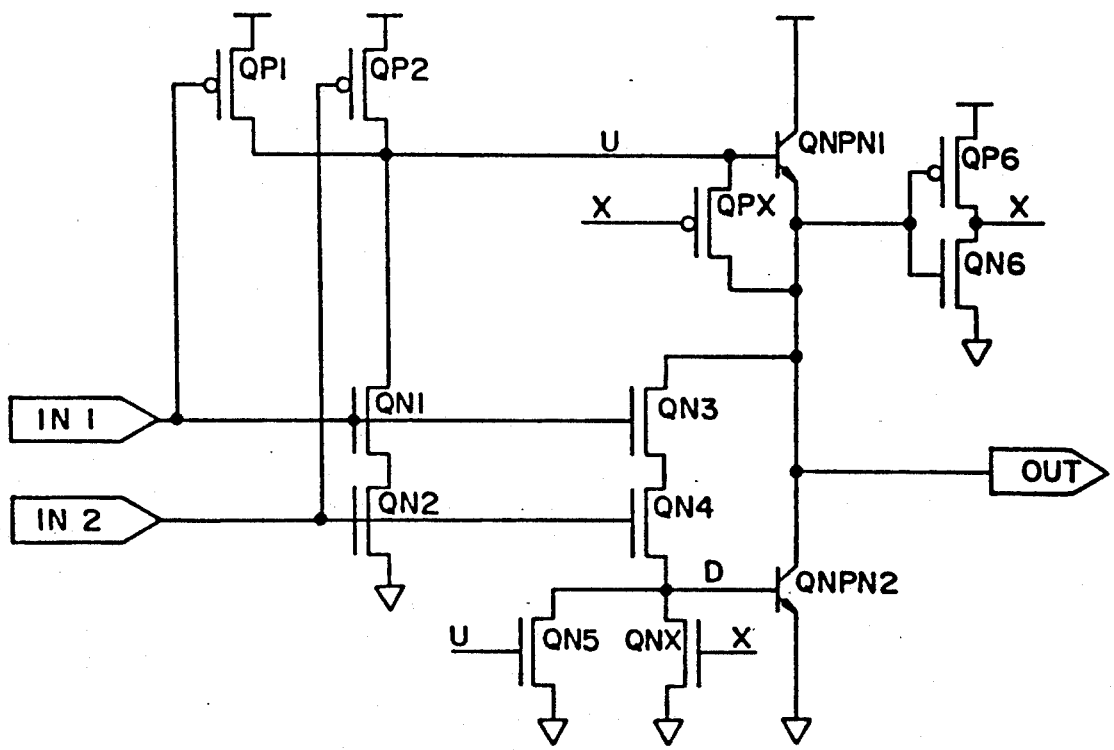
FIG.2 PRIOR ART FULL-SWING BiCMOS NAND

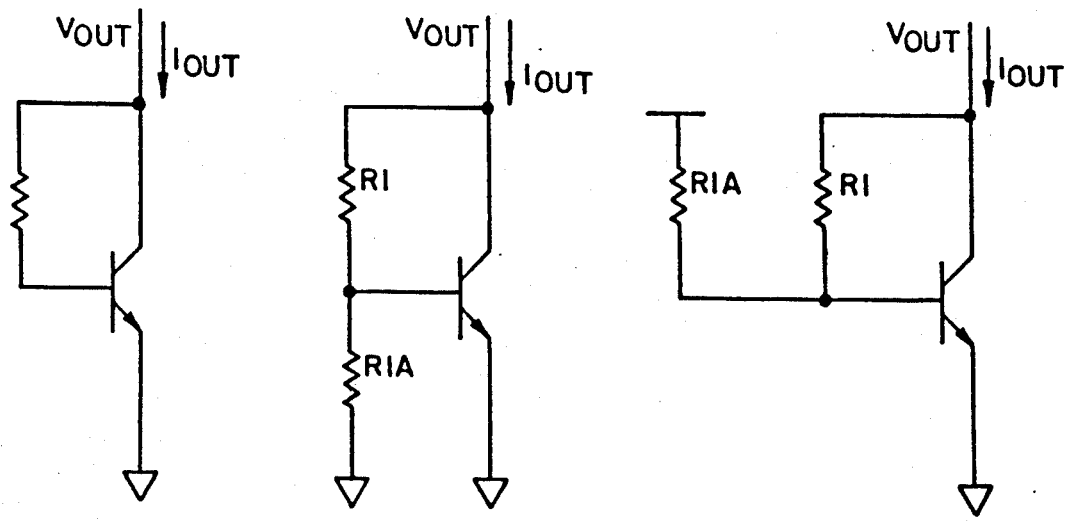
FIG. 3 A PRIOR ART GATED DIODE (ON), A PRIOR ART $V_{BE}$ MULTIPLIER AND A LOW-DROP GATED DIODE
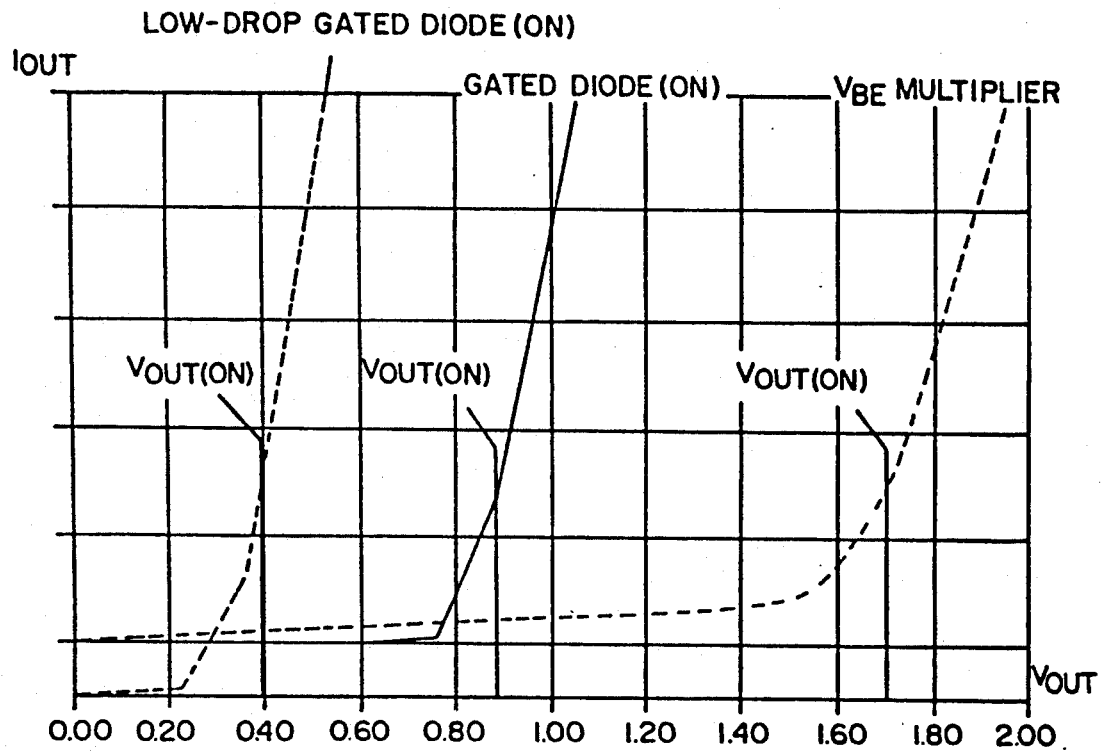
FIG. 4 I-V CURVES FOR THE CIRCUITS IN FIG. 3

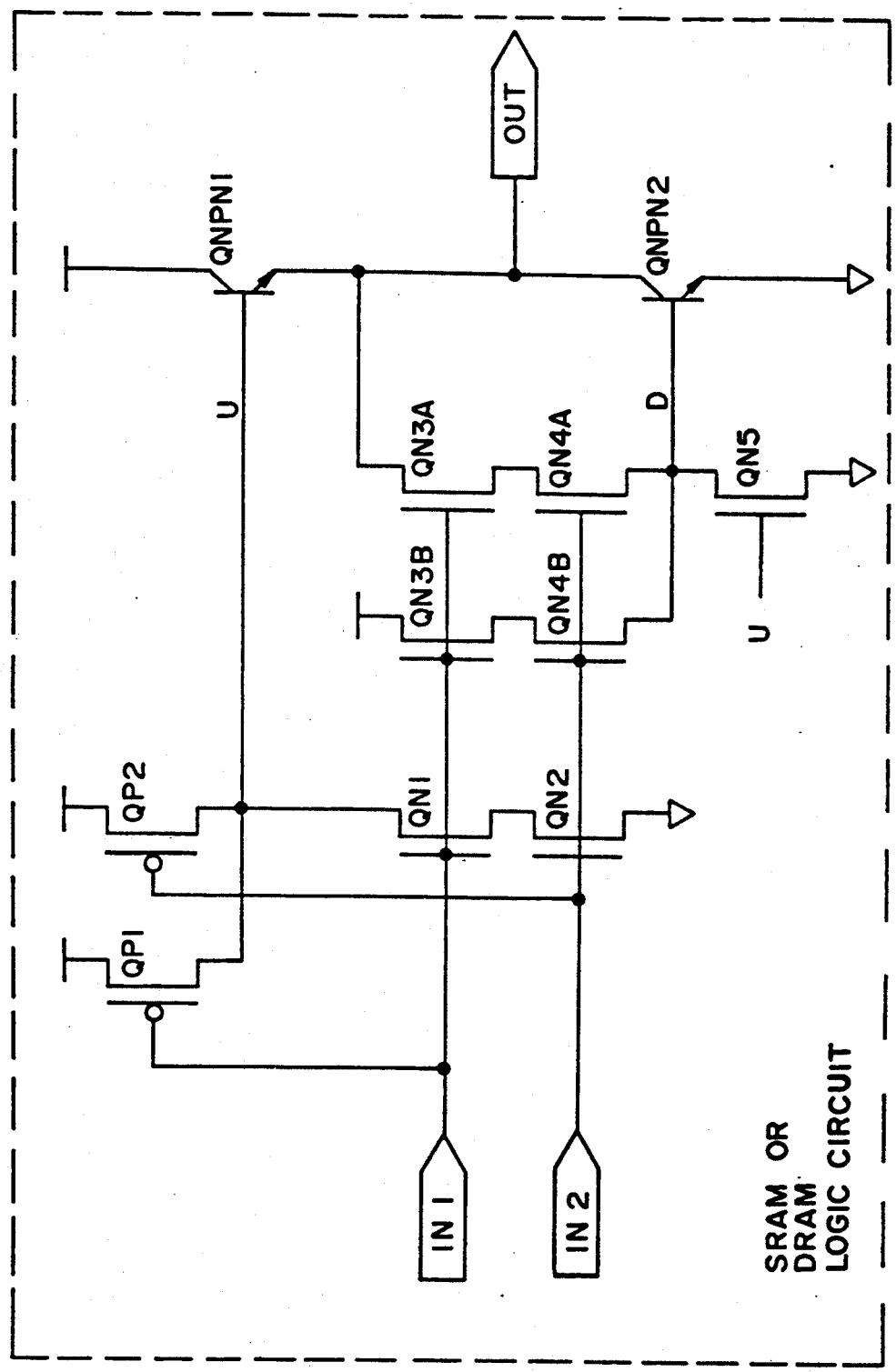
FIG. 5 BiCMOS NAND WITH LOW-DROP GATED DIODE

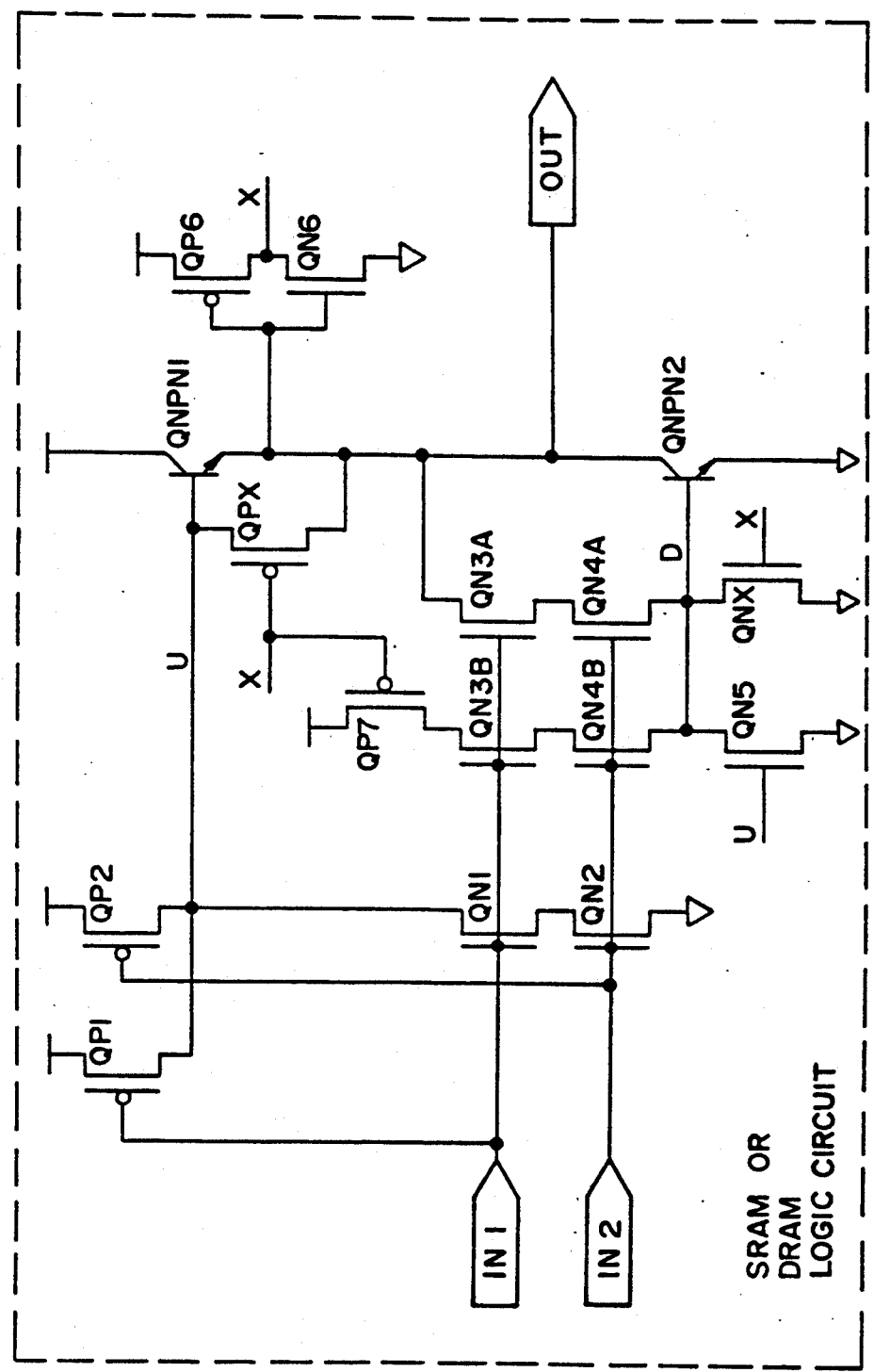
FIG.6 FULL-SWING BiCMOS NAND WITH LOW-DROP GATED DIODE

BICMOS DRIVER CIRCUITS WITH IMPROVED LOW OUTPUT LEVEL

BACKGROUND OF THE INVENTION

1. Field of the Invention

The present invention relates generally to a BiCMOS driver circuit with an improved low output level which is closer to ground than prior art circuits, both at full speed and with a static resistive load.

More particularly, the subject invention pertains to an improved BiCMOS (bipolar/CMOS mixed type) driver circuit as described wherein the driver circuit incorporates therein a gated diode pull-down with a low voltage drop, and in which a bipolar output transistor remains on for output voltages down to approximately 0.3 volts.

2. Discussion of the Prior Art

A conventional BiCMOS NAND circuit produces a low output level by turning on a gated diode between the output and ground. The gated diode cannot sink static current at output voltages below 1 VBE (~0.85 V). In practice, however, the output overshoots this level on waveform falling edges. If the driver's load is purely capacitive, the static low level can range from 0.3 V to 0.7 V, depending upon factors such as load capacitance and leakage currents.

The main advantages of designing driver circuits in BiCMOS rather than CMOS are a smaller delay for large load capacitances and a lower sensitivity of the delay to capacitance and temperature. The main performance disadvantages derive from the partial swing outputs of the BiCMOS circuit, which cause increased delays in following CMOS or BiCMOS circuits, have reduced noise margins, and can cause significant static power dissipation in following stages. As CMOS supply voltages are scaled down, these problems become more serious as the voltage drop of the gated diode does not scale down, and so is proportionately larger at smaller supply voltages.

Several full swing BiCMOS circuits have been proposed in the prior art in which an extra node is driven by a small CMOS inverter at the output. After the output falls, the voltage at the extra node rises and turns on a small transistor, and the output is then discharged to ground. These full swing circuits achieve full swing only under static conditions while discharging into capacitive loads. The added MOS transistors are relatively weak and do not affect the delay or shape of the initial transition, so a full swing driver circuit operating at full speed has the same output waveform as a conventional BiCMOS driver. Even at relatively low frequencies, the smaller initial transition still results in reduced drive in following CMOS or BiCMOS stages. It should also be noted that reducing an NFET's $V_{GS}$ from 3.6 V to 3.3 V or 3.0 V reduces its maximum output current by about 13% or 25%, respectively.

In general, the prior art provides other BiCMOS driver circuits of different designs, but the present invention provides the best design for this type of circuit at the present state of development of this technology.

Masuda et al. U.S. Pat. No. 4,890,017 entitled CMOS-BICMOS GATE CIRCUIT discloses a high-speed operation, low-power consumption gate circuit comprising a combination of complementary field-effect-transistors and bipolar transistors and a discharge for discharging accumulated charges from these transistors when the field-effect-transistors and bipolar transistors are turned off.

Ueno U.S. Pat. No. 4,845,386 entitled BI-MOS LOGIC CIRCUIT HAVING A TOTEM POLE TYPE OUTPUT BUFFER SECTION describes a totem pole type output buffer section comprising a pull-up NPN bipolar transistor and a pull-down NPN bipolar transistor. These NPN bipolar transistors are selectively switch-controlled by a first MOS FET. Another NPN bipolar transistor is darlington-connected to the pull-down NPN bipolar transistor, and is switch-controlled by the second MOS FET. The second MOS FET is of the same conductivity type as and has a gate connected to a gate of the first MOS FET.

Masuoka et al. U.S. Pat. No. 4,779,014 entitled BICMOS LOGIC CIRCUIT WITH ADDITIONAL DRIVE TO THE PULL-DOWN BIPOLAR OUTPUT TRANSISTOR describes a logic circuit which comprises at least one signal input terminal, an output terminal, an output circuit including a first bipolar transistor coupled between the output terminal and a reference potential terminal, to discharge the output terminal, and an MOS type logic circuit for supplying to the base of the first bipolar transistor a signal of a level corresponding to an input signal supplied to the at least one signal input terminal. The logic circuit further comprises a control MOS transistor coupled between a power source terminal and the base of the bipolar transistor, for supplying part of the base current to the bipolar transistor in response to a signal at the output terminal. In this patent, an implementation of a BiCMOS NAND driver using a low-drop gated diode is referred to as prior art, with the statement that the pull-down NPN transistor saturates. In fact, proper choice of the A/B width ratio allows the low output voltage to be set reliably below 0.5 V without driving QNPN2 into hard saturation.

Uragami et al. U.S. Pat. No. 4,694,203 entitled HIGH SPEED B-CMOS SWITCHING CIRCUIT describes a bipolar/CMOS mixed type switching circuit comprising two npn-type bipolar transistors connected in the form of a totem pole in the output stage, a CMOS inverter and an NMOSFET for driving these transistors in a complementary manner, and a resistance load for discharging the electric charge stored in the base of one transistor. The threshold voltage of an NMOSFET constituting the CMOS inverter in the absence of substrate effect is set to be substantially equal to the threshold voltage of the driver NMOSFET in the absence of the substrate effect, and the channel conductance of the driver NMOS-FET is so set that the threshold voltage of the CMOS inverter and the practical threshold voltage of the driver NMOSFET will be nearly the same.

Uragami et al. U.S. Pat. No. 4,678,943 entitled INVERTING LOGIC BUFFER BICMOS SWITCHING CIRCUIT USING AN ENABLING SWITCH FOR THREE-STATE OPERATION WITH REDUCED DISSIPATION discloses a switching circuit comprising a prestage circuit coupled to receive an input signal and an output stage, wherein an output signal having a phase opposite to that of a signal of an input terminal can be obtained from an output terminal of the output stage. The prestage circuit includes a p-channel MOSFET and an n-channel MOSFET that receive input signals at their gates. The output stage includes two NPN transistors and that are connected in series. The drain output of the p-channel MOSFET is applied to the base of one of the transistors of the output stage, and the source output of the n-channel MOSFET is applied to the base of the other of the transistors of the output stage. A third MOSFET is coupled between a power supply and the p-channel MOSFET and the n-channel MOSFET. When the third MOSFET is rendered nonconductive by a control signal, both other MOSFETs and both NPN transistors become nonconductive irrespective of the signal of the input terminal. Under this condition, the output terminal is in a floating state. Thus the switching circuit is a tri-state circuit.

SUMMARY OF THE INVENTION

Accordingly, it is a primary object of the present invention to provide a BiCMOS driver circuit with an improved low output level which is closer to ground than in prior art circuits, both at full speed and with a static (resistive) load.

A further object of the subject invention is an improved BiCMOS logic driver circuit with an improved low output level which can be used extensively in SRAM logic circuits and also possibly in DRAM logic circuits.

A further object of the subject invention is the provision of a driver circuit incorporating a gated diode pull-down with a lower voltage drop than in prior art driver circuits, in which a bipolar output transistor remains on for output voltages down to about 0.3 V. The voltage drop of the gated diode is set by device size ratios to be less than 0.5 V without driving the output transistor into hard saturation.

An additional object of the present invention is the provision of an NPN transistor circuit as described with improved low output level and high-to-low transitions. In a complementary BiCMOS process, analogous circuits with PNP transistors could be used for similar improvements in the high output level and low-to-high transitions.

In accordance with the teachings herein, the present invention provides a BiCMOS driver circuit with an improved low output level including a gated diode pull-down NPN transistor coupled between an output terminal and ground. A first switched current path formed by a first CMOS transistor pair is coupled between the output terminal and the base of the pull-down NPN transistor, and a second switched current path formed by a second CMOS transistor pair is coupled between the power supply $V_{DD}$ and the base of the pull-down NPN transistor. The circuit has improved low output level and high-to-low transitions. The circuit has particular applications to many types of logic gates, for example in NAND gates, NOR gates, and inverters, as are used extensively in static or dynamic random access memory logic circuits. Although the disclosed embodiments herein are for NAND gates, one skilled in the art could readily implement the teachings of the present invention in other logic circuits and gates, such as NOR gates and inverters with minor changes in the circuitry. The relative size or area of each transistor of each CMOS transistor pair is substantially equal, and is selected to achieve a low output ratio below 0.5 volts without driving said NPN transistor into saturation.

BRIEF DESCRIPTION OF THE DRAWINGS

The foregoing objects and advantages of the present invention for BiCMOS driver circuits with improved low output level may be more readily understood by one skilled in the art with reference being had to the following detailed description of several preferred embodiments thereof, taken in conjunction with the accompanying drawings wherein like elements are designated by identical reference numerals throughout the several views, and in which: FIG. 1 illustrates a conventional prior art BiCMOS NAND driver circuit;

FIG. 2 illustrates a typical full swing prior art BiCMOS NAND driver circuit;

FIG. 3 depicts conceptual forms of respectively a turned-on gated diode circuit, a $V_{BE}$ multiplier circuit, and a low-drop gated diode circuit;

FIG. 4 shows current I versus voltage V characteristic curves for the three circuits of FIG. 3;

FIG. 5 illustrates a BiCMOS driver circuit with a low-drop gated diode pursuant to the teachings of the present invention;

FIG. 6 illustrates a full swing BiCMOS driver circuit with a low-drop gated diode pursuant to the teachings of the subject invention.

DETAILED DESCRIPTION OF THE DRAWINGS

Figure 7:
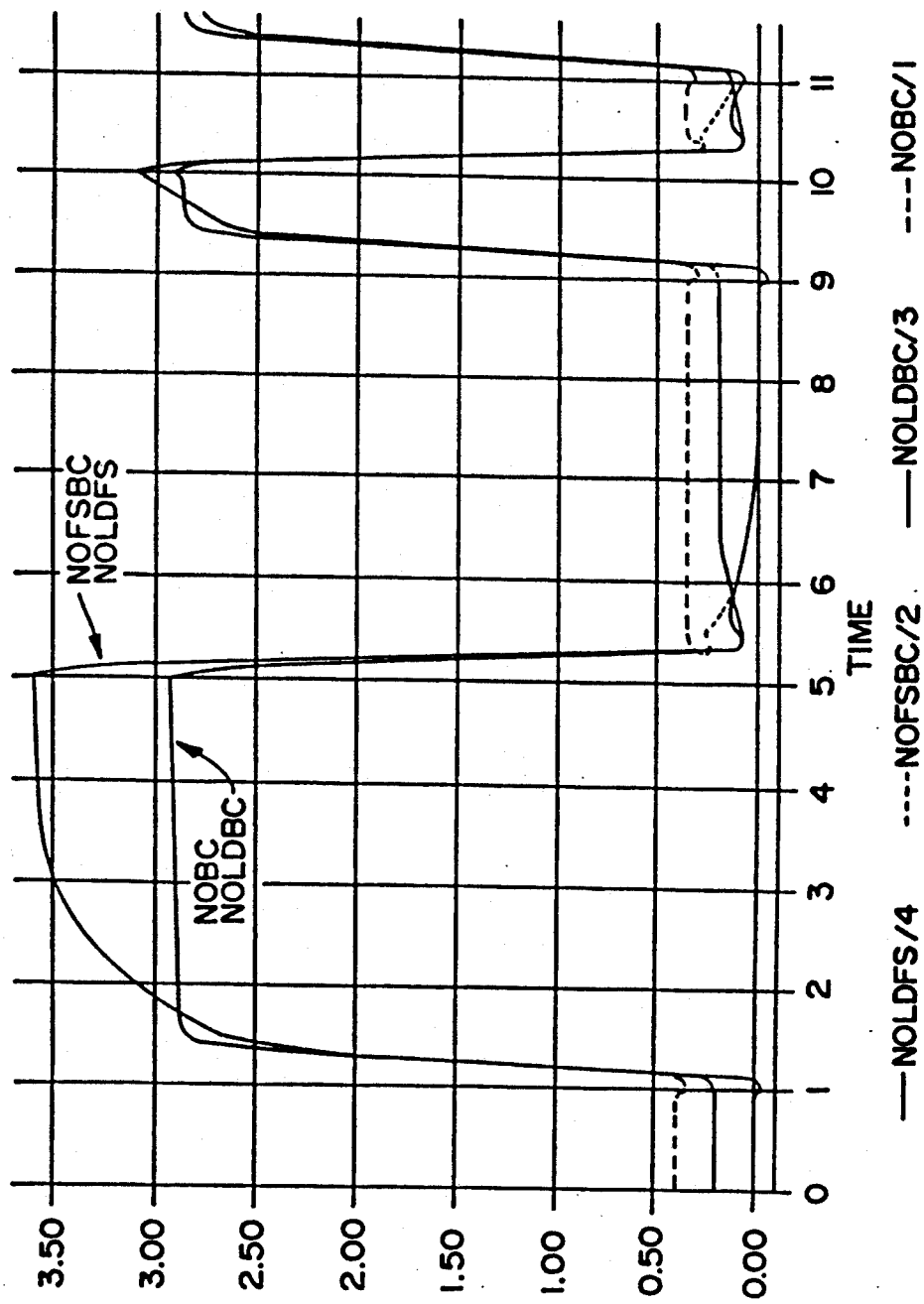
FIG. 7 illustrates voltage versus time waveforms for all of the circuits of FIGS. 1, 2, 5 and 6.

Referring to the drawings in detail, FIG. 1 illustrates a conventional and widely utilized BiCMOS NAND circuit comprising p channel MOSFETs QP1 and QP2 and n channel MOSFETs QN1 and QN2, and followed by an emitter follower QNPN1. Functioning as a NAND gate, when both inputs at IN1 and IN2 are high, the circuit produces a low output level at OUT by turning on a gated diode (comprising transistors QN3, QN4 and QNPN2) between the output and ground. In this circuit, the emitter follower QNPN1 functions to pull the output up to a high level, while the gated diode circuit functions to pull the output down to a low level. The n channel MOSFET QN5 connected to node U functions to draw extra charge from the base of QNPN2 as the output is being pulled up to a high level. The gated diode cannot sink static current at output voltages below 1 $V_{BE}$ (~0.85 V). In practice, however, the output overshoots this level on waveform falling edges. If the driver circuit load is purely capacitive, the static low level can range from 0.3 V to 0.7 V, depending upon factors such as load capacitance and leakage currents.

The main advantages of designing driver circuits in BiCMOS rather than CMOS are the smaller delays provided for large load capacitances and the lower sensitivity of the delay to capacitance and temperature. The main performance disadvantages derive from the partial swing outputs of the BiCMOS circuit, which cause increased delays in following CMOS or BiCMOS circuits, the circuits have reduced noise margins, and can also cause significant static power dissipation in the following stages. The static power dissipation results from the partial swing operation of the circuit of FIG. 1, as the following stage sees only partial high and low inputs and so is not completely turned off, resulting in leakage current and power dissipation. As CMOS supply voltages are scaled down, these problems become more serious as the voltage drop of the gated diode does not scale down, and so is proportionately larger at smaller supply voltages.

Several full swing BiCMOS circuits have been proposed in the prior art, and the driver circuit of FIG. 2 is typical in design and performance of these circuits. In these circuits, an extra node X is driven by a small CMOS inverter (QN6, QP6) at the output. When the output is high, the voltage at node X is low, which turns on QPX to pull the output to a higher high. When the output is low, the voltage at the extra node X rises and turns on a small transistor QNX, and the output is then discharged to ground through QN3; QN4 and QNX to pull the output to a lower low. These full swing circuits achieve higher highs and lower lows fairly slowly, and are full swing only under static conditions while discharging into capacitive loads. The added MOS transistors are relatively weak and do not affect the delay or shape of the initial transition, so a full swing driver operating at full speed has the same output waveform as a conventional BiCMOS driver. Even at relatively low frequencies, the smaller initial transition still results in reduced drive in following CMOS or BiCMOS stages. It should also be noted that reducing an NFET's $V_{GS}$ from 3.6 V to 3.3 V or 3.0 V reduces its maximum output current by about 13% or 25%, respectively.

A first embodiment of the present invention for a BiCMOS NAND driver using a low-drop gated diode is shown in FIG. 5. The circuit elements of FIG. 5 which are common to the circuit of FIG. 1 function in substantially the same manner. Additionally, the NMOSFET QN3 has been divided into two NMOSFETs QN3A and QN3B, and likewise QN4 has been divided into QN4A and QN4B. As is known in the art, an FET comprises a source electrode separated from a drain electrode by a gate electrode, and a larger area for each electrode results in greater current through the FET (and also a greater capacitance thereacross). Accordingly, to increase the area and current of an FET, it is frequently constructed as a multiple number of source electrodes separated from a multiple number of drain electrodes by a multiple number of gate electrodes, all constructed in an interleaved semiconductor structure forming one FET. The term "divided" above has been utilized as the multiple number of interleaved structures forming, for example, QN3 has been divided such that approximately one half of the interleaved electrode structures of QN3 now form QN3A and approximately one half of the interleaved electrode structures of QN3 now form QN3B, thus not increasing the overall area of the semiconductor structure or chip forming QN3A and QN3B over the area of the structure forming QN3, and likewise for QN4. An alternative embodiment could utilize QN3 as QN3A and add additional structure and area to the semiconductor device to form QN3B, and likewise for QN4, although the divided structure as explained hereinabove is preferred as the additional area and structure required for an additional QN3B and an additional QN4B is simply not required, considering the current requirements of the circuit.

In the circuit of FIG. 5, QN3A is coupled in the circuit in the same manner as QN3 in the circuit of FIG. 1, and likewise for QN4A and QN4, namely with the drain of QN3A coupled to the output and the source of QN4A coupled to the base of QNPN2. However the drain of QN3B is coupled to the power supply $V_{DD}$, not to the output, which alters the operation of the circuit of FIG. 5 as follows.

The current supplied to the base of QNPN2 flows first (I1) from the output through QN3A and QN4A, similar to the circuit of FIG. 1, and secondly (I2) flows from the power supply $V_{DD}$ through QN3B and QN4B. When the pull down operation starts, the voltage at the output is close to $V_{DD}$, and so I1 and I2 are initially high, but as the voltage at the output drops; I1 drops also, but I2 remains at the initial high level, thus supplying current to the base of QNPN2 at a higher rate and causing pull down to proceed to a lower level. The voltage between the base and emitter of QNPN2 to maintain QNPN2 on is $V_{BE}$ and always remains constant at approximately 0.85 V, and when the voltage at the output falls below $V_{BE}$, I1 reduces to zero and then starts to flow in a reverse direction. During this operation, I1 is initially small and I2 is initially large, and QNPN2 remains on until I1 reverses direction and effectively cancels I2, thus pulling the output voltage to a lower level.

The final pull down voltage of the circuit of FIG. 5 is set by the relative sizes (areas) of the A and B devices therein. If the A devices are relatively smaller, resulting in a higher resistance thereacross, the output is pulled down further. Whereas if the A devices are relatively larger, resulting in a lower resistance thereacross, then the voltage drop across QN3A and QN4A will be smaller, and the output will be pulled down less. Considering the operation of the A and B devices in the circuits, approximately equal sizes (areas) of the A and B devices are preferred, although variations in either direction are within the teachings of the present invention.

Assuming all NMOS transistors have the same effective channel length (the distance between the source and drain electrodes), the low output voltage is set by the width ratio $W_{QN3A}/W_{QN3B}$ ($=W_{QN4A}/W_{QN4B}$). It should be noted that if the total width of QN3A and QN3B in the new driver equals the width of QN3 in the conventional BiCMOS driver (FIG. 1), the new and conventional circuits will have nearly equal areas, input capacitances and initial base drive to QNPN2.

The BiCMOS driver in FIG. 5 has finite static power dissipation when its output is low, and so may be most suitable for driving a load that requires static current.

The disclosed embodiment of FIG. 5 is for a NAND gate. One skilled in the art could readily implement the teachings of the present invention in other logic circuits and gates, such as NOR gates and inverters with minor changes in the circuit. For instance, as recognized by one skilled in the art, a NOR gate could be constructed similar to the circuit of FIG. 5, but wherein transistors QP1 and QP2 are arranged in series, transistors QN1 and QN2 are in parallel, transistors QN3B and QN4B are in parallel, and transistors QN3A and QN4A are in parallel.

FIG. 6 illustrates a second embodiment of the present invention in a full swing BiCMOS driver with a low-drop gated diode. The circuit elements of FIG. 6 which are common to the circuit of FIG. 2 function in substantially the same manner, whereas the additional circuit elements in FIG. 6 of QN3B and QN4B function in the same manner as in FIG. 5. The additional circuit element QP7 isolates QN3B and QN4B from the power supply $V_{DD}$ when the circuit goes low. When the output goes low, node X goes high, which turns QP7 off to turn off the path to $V_{DD}$ for QN3B and QN4B. When node X goes high, it also turns on QNX to provide a static load path to ground, all of which allows the output to proceed to a lower low. When the output goes low, QP7 turns off the static current path through QN3B and QN4B, and the output is then discharged completely to GND through QN3A, QN4A and QNX. The inclusion of the low-drop gated diode circuit allows the initial falling edge to reach a lower output voltage. The final approach to GND is slow, as in previous full swing circuits.

FIG. 3 presents a comparison, in conceptual form, of a turned on gated diode, a $V_{BE}$ multiplier, and a low-drop gated diode. In the gated diode circuit shown at the left in FIG. 3, the resistance R1 corresponds to the resistance across QN3 and QN4 of FIG. 1. The $V_{BE}$ multiplier circuit shown in the middle of FIG. 1 is a type of circuit well known in the prior art, and is used in many circuits requiring a voltage$>1V_{BE}$. A $V_{BE}$ multiplier circuit drives the voltage at the the collector to a higher voltage than $V_{BE}$, and is included in FIG. 3 for comparison purposes. In the low-drop gated diode circuit shown in the right portion of FIG. 3, R1A corresponds to the resistance across QN3B and QN4B, and R1 corresponds to the resistance across QN3A and QN4A.

Current/voltage characteristic curves for these three circuits are shown in FIG. 4. In the $V_{BE}$ multiplier and the low-drop gated diode, the resistance ratio R1/R1A determines $V_{OUT(ON)}$, the output voltage for which the base is at $V_{BE(ON)}$. While $V_{OUT(ON)} < V_{BE(ON)}$ for the multiplier, $V_{OUT(ON)} < V_{BE(ON)}$ for the low-drop gated diode. A comparison of the I/V curves for the low-drop gated diode circuit and for the gated diode circuits shows that they are very similar, except for the lower voltages of the low-drop gated diode circuit of the present invention, hence the chosen name for the present invention of a low-drop gated diode circuit.

FIG. 7 illustrates output waveforms for each of the four driver circuits of FIGS. 1, 2, 5 and 6 discussed hereinabove. More particularly, FIG. 7 illustrates the output waveforms of BiCMOS NANDs driving capacitive loads wherein: NOBC is the waveform for a conventional BiCMOS; NOFSBC is the waveform for a full-swing BiCMOS; NOLDBC is the waveform for a BiCMOS with low-drop gated diode; and NOLDFS is the waveform for a full-swing BiCMOS with low-drop gated diode. Because the new driver circuits of the present invention achieve a low output below 0.5 V at all operating frequencies and without driving QNPN2 into hard saturation, the new driver circuits lessen or remove several drawbacks of previously reported BiCMOS driver circuits.

While several embodiments and variations of the present invention for BiCMOS driver circuits with improved low output level are described in detail herein, it should be apparent that the disclosure and teachings of the present invention will suggest many alternative designs to those skilled in the art.

Having thus described our invention, what we claim as new and desire to secure by Letters Patent is:

1. A BiCMOS gated diode pull-down NPN transistor circuit with an improved low output level comprising, a pull-down NPN transistor coupled between the output terminal and ground, a first switched current path comprising a first CMOS transistor pair coupled between the output terminal and the base of said pull-down NPN transistor, and a second switched current path comprising a second CMOS transistor pair coupled between the power supply $V_{DD}$ and the base of said pull-down NPN transistor, which circuit improves the low output level and the high-to-low transition of the circuit.

2. A circuit as claimed in claim 1, in a logic circuit.

3. A circuit as claimed in claim 1, in an NAND gate wherein said first CMOS transistor pair are coupled in series and said second CMOS transistor pair are coupled in series.

4. A circuit as claimed in claim 1, wherein the relative size or area of each transistor of each CMOS transistor pair is substantially equal.

5. A circuit as claimed in claim 1, wherein the relative size or area of each transistor of each BiCMOS pair is selected to achieve a low output ratio below 0.5 volts without driving said NPN transistor into saturation.

* * * * *